(12) United States Patent
Naritomi et al.

(10) Patent No.: US 6,329,842 B1
(45) Date of Patent: Dec. 11, 2001

(54) OUTPUT CIRCUIT FOR ELECTRONIC DEVICES

(75) Inventors: Hiroshi Naritomi, Kasugai; Osamu Kobayashi, Kawasaki, both of (JP)

(73) Assignee: Fujitsu Limited, Kanagawa (JP)

( * ) Notice: Subject to any disclaimer, the term of this patent is extended or adjusted under 35 U.S.C. 154(b) by 0 days.

(21) Appl. No.: 09/547,348

(22) Filed: Apr. 11, 2000

(30) Foreign Application Priority Data

Apr. 27, 1999 (JP) ................................... 11-120069

(51) Int. Cl.[7] ............................................... H03K 19/0175
(52) U.S. Cl. ................... 326/81; 326/57; 326/83
(58) Field of Search .................... 326/81, 80, 57, 326/58, 83

(56) References Cited

U.S. PATENT DOCUMENTS

| | | | |
|---|---|---|---|
| 5,721,508 | * | 2/1998 | Rees ...................................... 327/382 |
| 5,933,025 | * | 8/1999 | Nance et al. ............................ 326/81 |
| 5,990,705 | * | 11/1999 | Lim ........................................ 326/81 |
| 6,028,450 | * | 2/2000 | Nance .................................... 326/81 |
| 6,043,681 | * | 3/2000 | Lim ........................................ 326/81 |

FOREIGN PATENT DOCUMENTS 5-7149    1/1993   (JP) .

* cited by examiner

*Primary Examiner*—Michael Tokar
*Assistant Examiner*—David D. Chang
(74) *Attorney, Agent, or Firm*—Arent Fox Kintner Plotkin & Kahn, PLLc

(57) ABSTRACT

An output circuit that prevents the flow of a leakage current from its output terminal to a power supply is able to accommodate voltage levels higher than the power supply voltage level. The output circuit includes a p-channel MOS transistor connected between the output terminal and a high potential power supply. A first switch circuit is connected between the transistor and the high potential power supply. The first switch circuit selectively connects and disconnects a back-gate of the transistor and the high potential power supply in response to an external signal applied to the output terminal.

24 Claims, 5 Drawing Sheets

Fig.1 (a) (Prior Art)
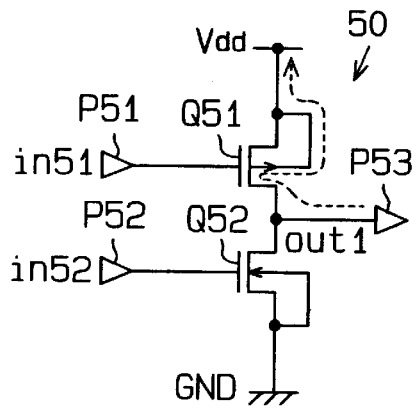
Fig.1 (b) (Prior Art)
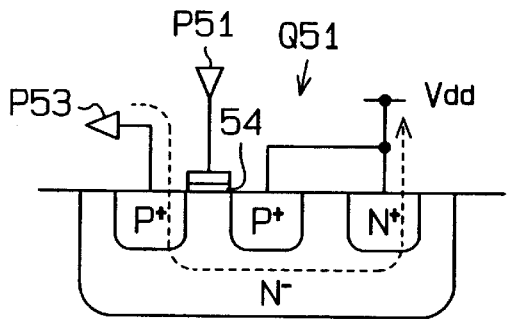
Fig.1 (c) (Prior Art)
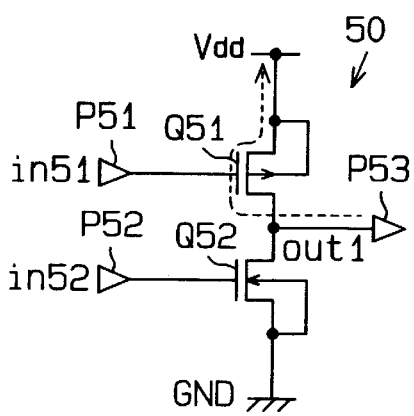
Fig.1 (d) (Prior Art)
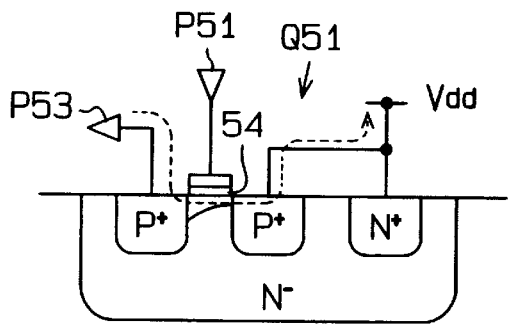
Fig.2 (Prior Art)
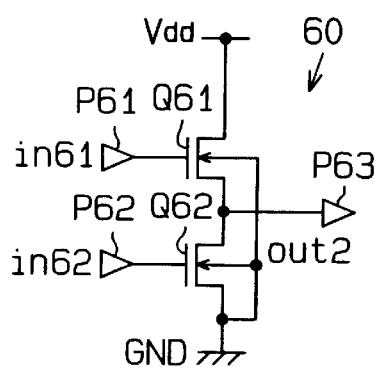

Fig.4

| Condition / Node No. | Power Supply ON | | | | Power Supply OFF |
|---|---|---|---|---|---|
| | Condition A | | Condition B | Condition C | Condition D |
| | High Output | Low Output | VPO≤Vdd+Vthp | VPO>Vdd+Vthp | VPO>Vdd+Vthp |
| | | | Hi-Z Output | | |
| N1 | GND | | Floating (VN1≤VPO+VDF) | VPO | VPO |
| N2 | Vdd | | Vdd | $\left(\frac{Vdd+VPO}{2}\right)$ | $\frac{VPO}{2}$ |
| N3 | Vdd | | Vdd | VPO | VPO |
| N4 | GND | | Vdd−Vthn | $\left(\frac{Vdd+VPO}{2}\right)$ | $\frac{VPO}{2}$ |
| N5 | Vthp (VN1+Vthp) | Vout<VN5<Vdd | Vdd+VDF or less | VN4+Vthp | VN4+Vthp |
| N6 | Vdd | Vdd | Vdd | VN4+Vthp | VN4+Vthp |

OUTPUT CIRCUIT FOR ELECTRONIC DEVICES

BACKGROUND OF THE INVENTION

The present invention relates to an output circuit, and more particularly, to an output circuit for preventing leakage current from flowing through the output circuit when a voltage higher than the power supply level is applied to the output terminal.

FIG. 1(a) is a schematic circuit diagram showing a first example of an output circuit 50 used in an electronic device. The output circuit 50 includes a push-pull circuit having a CMOS configuration. The source of a push PMOS transistor Q51 is connected to a power supply Vdd, and the source of a pull NMOS transistor Q52 is connected to the ground GND. An internal circuit (not shown) provides the gate of the PMOS transistor Q51 (i.e., internal input terminal P51) with a first internal signal in51 and the gate of the NMOS transistor Q52 (i.e., internal input terminal P52) with a second internal signal in52. The drains of the MOS transistor Q51, Q52 are connected to each other. A node between the drains (i.e., output terminal P53 of the output circuit 50) is connected to a bus line (not shown).

During normal output operation of the output circuit 50, the output circuit 50 receives the first and second internal signals in51, in52, the logic levels of which are the same, from the internal circuit. The output circuit 50 then provides a signal, the logic level of which is inverted from the levels of the first and second internal signals in51, in52, as an output data out1 to the bus line via the output terminal P53. That is, in response to the first and second internal signals in51, in52, the output circuit 50 provides the bus line with output data signals out1 having the power supply level Vdd and the ground level GND. When the first internal signal in51 provided to the MOS transistors Q51 goes high and the second internal signal in52 provided to the transistor Q52 goes low, the MOS transistors Q51, Q52 are deactivated and the output terminal P53 is set to a high impedance (Hi-Z) state.

FIG. 2 is a schematic diagram showing a second prior art example of an output circuit 60 employed in an electronic device. The output circuit 60 includes a push-pull circuit formed by connecting NMOS transistors Q61, Q62 in series between a power supply Vdd and the ground GND. An internal circuit (not shown) provides the gate of the NMOS transistor Q61 (i.e., internal input terminal P61) with a first internal signal in61 and the gate of the NMOS transistor Q62 (i.e., internal input terminal P62) with a second internal signal in62. A node between the NMOS transistors Q61, Q62 (i.e., output terminal P63 of the output circuit 60) is connected to a bus line.

During normal output operation of the output circuit 60, the output circuit 60 receives the first and second internal signals in61, in62, the logic levels of which are inverted from each other. The output circuit 60 then provides the bus line with an output data signal out2 having the same logic level as the first internal signal in61. When the internal signals in61, in62 provided to the output circuit 60 both go low, the MOS transistors Q61, Q62 are deactivated and the output terminal P63 is set to a high impedance (Hi-Z) state.

However, data having a level higher than the power supply levels of the output circuits 50, 60 may be provided to the bus line from other devices. In such case, the application of a voltage, which level is higher than the power supply, to the corresponding output terminals P53, P63 would result in the shortcomings discussed below.

In the output circuit 50, the application of a voltage higher than the sum of the power supply Vdd voltage and a forward voltage VDF between the drain and back gate of the transistor Q51 (Vdd+VDF) to the output terminal P53 would cause a leakage current to flow through the output terminal P53, the source and back gate of the PMOS transistor Q51, and to the power supply Vdd, as shown by the broken line in FIGS. 1(a) and 1(b). This is because the circuit between the source and the back gate of the PMOS transistor Q51 is equivalent to a diode connected in a forward direction.

Further, the transistor Q51 is deactivated when a voltage higher than the sum of the gate voltage of the PMOS transistor Q51 and a threshold voltage Vthp of the transistor Q51 is applied to the output terminal P53 in a high impedance (Hi-Z) state. This would cause a leakage current to flow from the bus line and to the power supply Vdd through the output terminal P53 and the drain and source of the PMOS transistor Q51, as shown by the broken line in FIGS. 1(c) and 1(d).

In the output circuit 60, leakage current does not flow when the voltage of the data signal at the bus line is higher than the power supply Vdd voltage. This is because the circuit between the drain (output terminal P63) and the back gate of the NMOS transistor Q61 is equivalent to a diode connected in a reverse direction. However, the output circuit 60 outputs the data signal out2 having a voltage lower than the gate voltage of the transistor Q61 by the threshold voltage Vthn of the NMOS transistor Q61. Accordingly, the data signal generated by the output circuit 60 cannot perform full swing between the power supply Vdd level and the ground GND level.

When a voltage higher than the power supply Vdd level is applied to each of the output terminals P53, P63, the potential difference between the output terminals P53, P63 and the associated input terminals P51, P52, P61, P62 is increased. Thus, a gate oxidation film, which is applied to each of the MOS transistors Q51, Q52, Q61, Q62 between the source and gate (FIGS. 1(b) and 1(d)), is formed with increased thickness to resist high voltages.

However, the MOS transistors Q51, Q52, Q61, Q62 must undergo a special process to form the thick gate oxidation films. This complicates the manufacturing process and increases manufacturing cost.

SUMMARY OF THE INVENTION

It is a first object of the present invention to provide an output circuit that inhibits the flow of a leakage current from the output terminal to the power supply.

It is a second object of the present invention to provide an output circuit that is not required to resist high voltages.

To achieve the above objects the present invention provides an output circuit having an output terminal. The output circuit includes at least one p-channel MOS transistor connected between the output terminal and a high potential power supply, and having a back gate, and a first switch circuit connected between the at least one p-channel MOS transistor and the high potential power supply. The first switch circuit selectively connects and disconnects the back gate of the at least one p-channel MOS transistor and the high potential power supply in response to an external signal applied to the output terminal.

Another aspect of the present invention provides an output circuit having an output terminal. The output circuit includes at least one p-channel MOS transistor connected between the output terminal and a high potential power supply, and a switch circuit connected between a gate of the at least one transistor and the output terminal. The switch circuit connects the gate of the at least one p-channel MOS transistor to the output terminal in response to an external signal applied to the output terminal.

A further aspect of the present invention provides an output circuit having an output terminal. The output circuit includes a plurality of p-channel MOS transistors connected between the output terminal and a high potential power supply, a plurality of n-channel MOS transistors connected between the output terminal and a low potential power supply, and a voltage generating circuit connected to a gate, which is located close to the output terminal, of one of the p-channel MOS transistors and the n-channel MOS transistors. The voltage generating circuit adjusts the potential applied to the gate in response to an external signal applied to the output terminal so that a potential difference between the output terminal and the gate is less than a voltage resistance value of the gate connected transistor.

A further aspect of the present invention provides an output circuit having an output terminal. The output circuit includes a plurality of p-channel MOS transistors, including a first p-channel MOS transistor which has a back gate, connected in series between the output terminal and a high potential power supply. A first switch circuit is connected between the back gate of the first p-channel MOS transistor and the high potential power supply. The first switch circuit selectively connects and disconnects the back gate of the first transistor and the high potential power supply in response to an external signal applied to the output terminal. A voltage generating circuit is connected to a gate of the first p-channel MOS transistor. The voltage generating circuit adjusts the potential applied to the gate of the first p-channel MOS transistor in response to an external signal applied to the output terminal so that a potential difference between the output terminal and the gate is less than a voltage capacity of the transistor.

A further aspect of the present invention provides an input/output circuit. The input/output circuit includes at least one p-channel MOS transistor connected between an output terminal and a high potential power supply, and has a back gate. A main output circuit including a first switch circuit is connected between the back gate of the at least one p-channel MOS transistor and the high potential power supply. The first switch circuit selectively connects and disconnects the back gate of the transistor and the high potential power supply in response to an external signal applied to the output terminal. The input/output circuit further includes an input buffer, an input circuit including an n-channel MOS transistor connected between the input buffer and the output terminal, and a voltage generating circuit connected to a gate of the n-channel MOS transistor. The voltage generating circuit adjusts the potential applied to the gate of the n-channel MOS transistor in response to the external signal applied to the output terminal so that a potential difference between the output terminal and the gate of the n-channel MOS transistor is less than a voltage capacity of the n-channel MOS transistor.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIGS. 1(a)–1(d) are circuit diagrams showing a first prior art example of an output circuit;

FIG. 2 is a circuit diagram showing a second prior art example of an output circuit;

FIG. 4 is a table describing potential changes at each node of the input/output terminal;

DETAILED DESCRIPTION OF THE PREFERRED EMBODIMENTS

Figure 3:
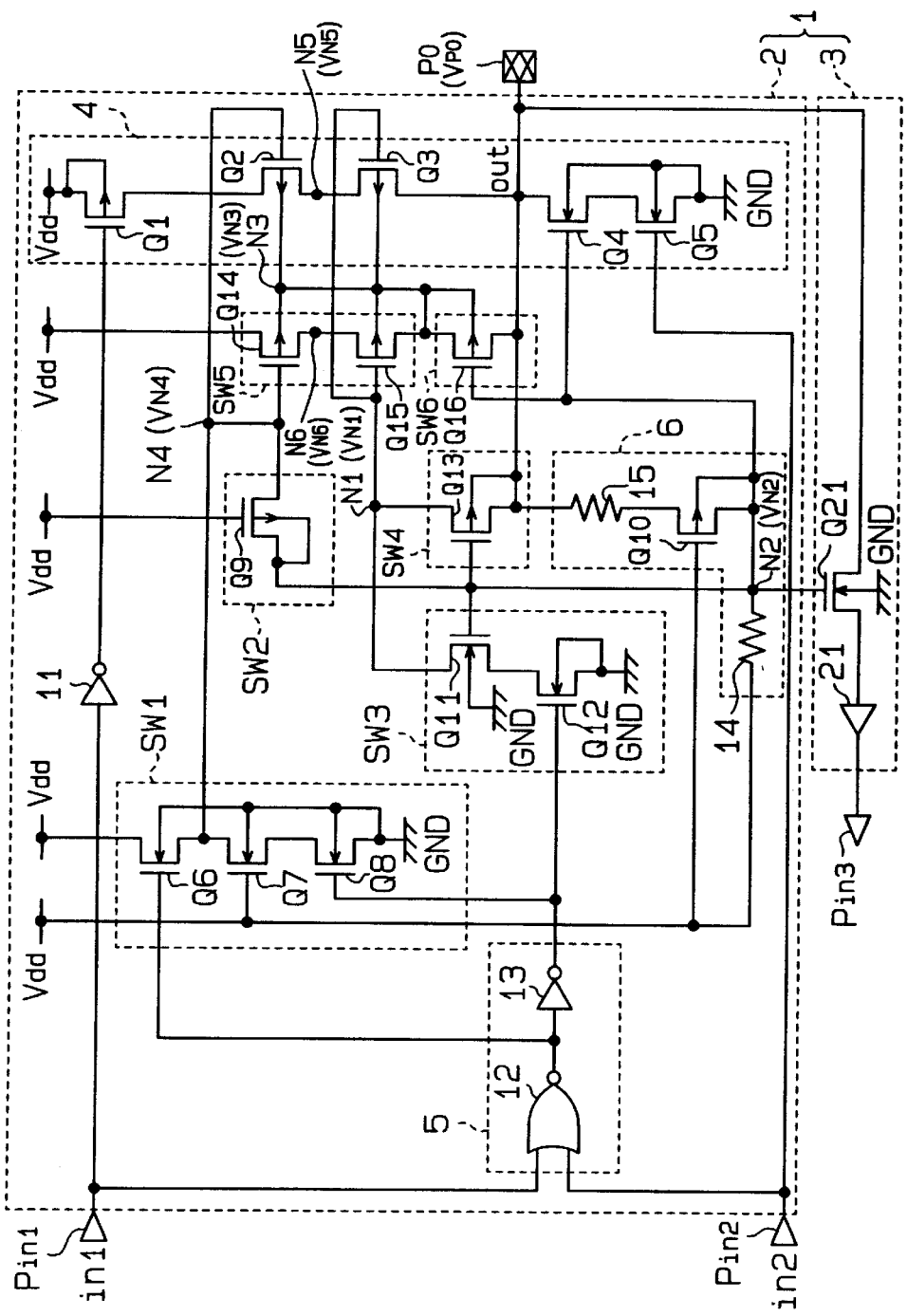
FIG. 3 is a circuit diagram showing an input/output circuit according to the present invention.

FIG. 3 is a schematic circuit diagram showing an electronic device input/output (I/O) circuit 1 according to the present invention. The I/O circuit 1 has an output circuit 2 and an input circuit 3. The output circuit 2 includes a main output circuit 4, a control circuit 5, a voltage generating circuit 6, and first to sixth switch circuits SW1–SW6.

The main output circuit 4 has a CMOS configuration that includes PMOS transistors Q1–Q3 and NMOS transistors Q4, Q5 connected in series between a power supply Vdd and the ground GND. The main output circuit 4 generates an output data signal out, which is provided to an external input/output (I/O) terminal PO, from a node between the PMOS transistor Q3 and the NMOS transistor Q4. The I/O terminal PO is connected to various electronic devices via bus lines (not shown).

The gate of the PMOS transistor Q1 is connected to an internal input terminal Pin1 of the I/O circuit 1 via an inverter 11. An internal circuit (not shown) provides the internal input terminal Pin1 with a first internal signal in1. The gate of the NMOS transistor Q5 is connected to an internal input terminal Pin2. The internal circuit provides the internal input terminal Pin2 with a second internal signal in2.

During normal output operation of the output circuit 2, the output circuit 2 is provided with the second internal signal in2, the logic level of which is inverted from that of the first internal signal in1. When the internal signals in1, in2 are both low, the output circuit 2 sets the I/O terminal PO in a high impedance state.

The control circuit 5 includes a NOR circuit 12 and an inverter 13. The NOR circuit 12 has two input terminals provided with the first and second internal signals in1, in2. The output signal of the NOR circuit 12 is provided to the first switch SW1 and the inverter 13. The output signal of the inverter 13 is provided to the first switch circuit SW1 and the third switch circuit SW3.

The first switch circuit SW1 includes NMOS transistors Q6–Q8 connected in series between the power supply Vdd and the ground GND. The output signal of the NOR circuit 12 is provided to the gate of the NMOS transistor Q6. The output signal of the NOR circuit 12 is also inverted by the inverter 13 and provided to the gate of the NMOS transistor Q8. The gate of the NMOS transistor Q7 is connected to the power supply Vdd. A node N4 between the NMOS transistors Q6, Q7 is connected to the gate of the PMOS transistor Q2 in the main output circuit 4.

The PMOS transistor Q2 gate (node N4) is connected to the voltage generating circuit 6 via a second switch circuit SW2. The second switch circuit SW2 includes a PMOS transistor Q9, the gate of which is connected to the power supply Vdd.

The voltage generating circuit 6 includes resistors 14, 15 and a PMOS transistor Q10, which are connected in series between the power supply Vdd and the I/O terminal PO. The resistors 14 and 15 have the same resistance. The PMOS transistor Q10 has a gate connected to the power supply Vdd and a back gate connected to a node N2 between the resistor 14 and the PMOS transistor Q10. The node N2 is connected to the gate of the NMOS transistor Q4 of the main output circuit 4 and to the sixth switch circuit SW6.

The third switch circuit SW3 includes NMOS transistors Q11, Q12 connected in series between the ground GND and the PMOS transistor Q3 gate (node N1) of the main output circuit 4. The gate of the NMOS transistor Q11 is connected to the node N2. The gate of the NMOS transistor Q12 is provided with the output signal of the inverter 13.

The fourth switch circuit SW4 includes a PMOS transistor Q13 connected between the PMOS transistor Q3 gate (node N1) and the I/O terminal PO. The PMOS transistor Q13 has a gate connected to the node N2 and a back gate connected to the I/O terminal PO.

The back gates of the PMOS transistors Q2, Q3 are connected to each other at a node N3. The node N3 is connected to the power supply Vdd via the fifth switch circuit SW5 and to the I/O terminal PO via the sixth switch circuit SW6.

The fifth switch circuit SW5 includes PMOS transistors Q14, Q15 connected in series between the power supply Vdd and the node N3. The back gates of the PMOS transistors Q14, Q15 are connected to the node N3. The gate of the PMOS transistor Q14 is connected to the node N4. The gate of the PMOS transistor Q15 is connected to the node N1.

The sixth switch circuit SW6 includes a PMOS transistor Q16 having a gate connected to the node N2 and a back gate connected to the node N3.

The input circuit 3 includes an NMOS transistor Q21 and an input buffer 21 connected in series between the I/O terminal PO and an internal output terminal Pin3. The gate of the NMOS transistor Q21 is connected to the node N2. The input buffer 21 provides the data received from the I/O terminal PO to an internal circuit (not shown) via the internal output terminal Pin3.

The operation of the I/O circuit 1 will now be described with reference to FIG. 4.

FIG. 4 is a chart showing the potential at each of the nodes in the I/O circuit 1 under conditions A, B, C, and D. The potentials of the nodes N1–N4 are represented by VN1–VN4, respectively. The potential at the I/O terminal PO is represented by VPO. The potential at a node N5 between the PMOS transistors Q2, Q3 of the main output circuit 4 is represented as VN5. The potential at a node N6 between the PMOS transistors Q14, Q15 of the fifth switch circuit SW5 is represented as VN6.

[Condition A: normal output operation]

The output circuit 2 is provided with the power supply Vdd. The internal circuit provides the NOR circuit 12 with the first internal signal in1 and the second internal signal in2, the logic level of which is inverted from the first internal signal in1, and causes the NOR circuit 12 to output a low signal. The output circuit 2 receives the first and second internal signals in1, in2 and outputs the data signal out with a level corresponding to the levels of the internal signals in1, in2. If a voltage higher than the power supply Vdd level is applied to the I/O terminal PO when the data signal out generated by the output circuit 2 is high (power supply Vdd level), the difference between the potential VPO at the I/O terminal PO and the power supply Vdd level activates the PMOS transistor Q10. The difference between the potential VPO and the power supply Vdd level may be decreased by increasing the size of the PMOS transistor Q10 and decreasing its on resistance. Activation of the PMOS transistor Q10 inhibits the potential VPO at the I/O terminal PO to a level equal to or lower than Vdd+Vthp.

In the first switch circuit SW1, the low signal from the NOR circuit 12 deactivates the NMOS transistor Q6 and activates the NMOS transistors Q7, Q8. Accordingly, the potential VN4 at the node N4 is set at the ground GND level.

Since the potential VPO at the I/O terminal PO does not exceed the Vdd+Vthp level, the PMOS transistor Q10 of the voltage generating circuit 6 is deactivated and the node N2 is set at the power supply Vdd level. The power supply Vdd level at the node N2 deactivates the PMOS transistor Q9.

Since the node N2 is at the power supply Vdd level and the potential VPO at the I/O terminal PO does not exceed the Vdd+Vthp level, the PMOS transistor Q13 of the fourth switch circuit SW4 and the PMOS transistor Q16 of the sixth switch circuit SW6 are both deactivated.

In the third switch circuit SW3, the transistor Q12 is activated when the inverter 13 generates a high signal (the NOR circuit 12 generating a low signal), and the NMOS transistor Q11 is activated when the node N2 is at the power supply Vdd level. Accordingly, the potential VN1 at the node N1 is set at the ground GND level.

In the fifth switch circuit SW5, the PMOS transistors Q14, Q15 are activated when the associated nodes N1, N4 are at the ground GND level. This connects the back gates of the PMOS transistors Q2, Q3 in the main output circuit 4 to the power supply Vdd.

In the main output circuit 4, the PMOS transistors Q2, Q3 are activated when the associated nodes N1, N4 are at the ground GND level, and the NMOS transistor Q4 is activated when the node N2 is at the power supply Vdd level.

Figure 5:
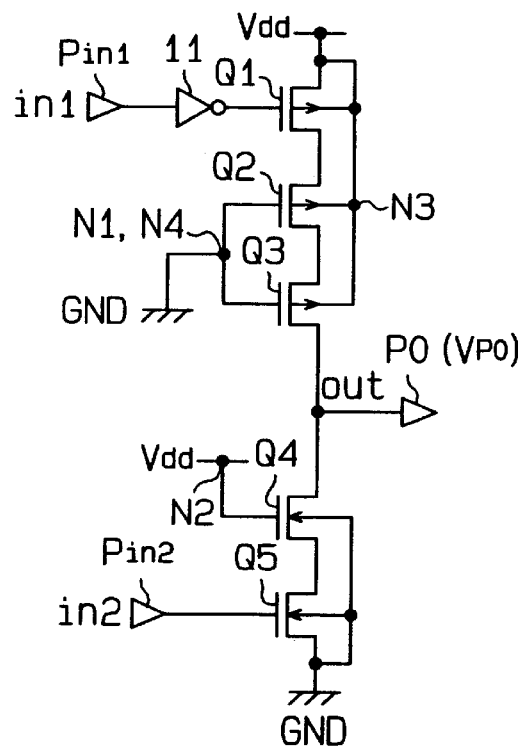
FIG. 5 is an equivalent circuit diagram of the input/output circuit under condition A of FIG. 4.

FIG. 5 is an equivalent circuit diagram showing the operation of the output circuit 2 under condition A of FIG. 4. In the main output circuit 4, when the first internal signal in1 is high and the second internal signal in2 is low, the PMOS transistor Q1 is activated, the NMOS transistor Q5 is deactivated, and the data output signal out generated at the I/O terminal PO goes high (power supply Vdd level).

When the first internal signal in1 is low and the second internal signal in2 is high, the PMOS transistor Q1 is deactivated, the NMOS transistor Q5 is activated, and the data output signal out generated at the I/O terminal PO goes low (ground GND level).

The employment of the PMOS transistors Q1–Q3 as push transistors fully swings the data signal out between the power supply Vdd level and the ground GND level.

The PMOS transistors Q2, Q3 and the NMOS transistor Q4 are maintained in an activated state during normal output operation of the output circuit 2. Thus, the data signal out is stable during the normal output operation. If the activation and deactivation of the PMOS transistors Q2, Q3 were to be synchronized with the PMOS transistor Q1, and the activation and deactivation of the NMOS transistor Q4 were to be synchronized with the NMOS transistor Q5, operational noise of the transistors Q2–Q4 would be included in the data signal out.

[Condition B: the I/O terminal PO being in a high impedance (Hi-Z) state when a voltage equal to or lower than the Vdd+Vthp level is applied to the I/O terminal PO]

The internal circuit provides the output circuit 2 with low first and second internal signals n1, in2 and causes the NOR circuit 12 to output a high signal. In this case, the potential VPO at the I/O terminal PO is equal to or lower than the level of Vdd+Vthp.

In the first switch circuit SW1, the NMOS transistor Q6 is activated by the high signal from the NOR circuit 12, the NMOS transistor Q8 is deactivated by the signal output by the inverter 13, and the NMOS transistor Q7 is activated by the power supply Vdd. Accordingly, the node N4 is set at a level lower than the power supply Vdd by the threshold voltage Vthn of the NMOS transistor Q6, or at a Vdd−Vthn level.

The PMOS transistor Q10 of the voltage generating circuit 6 is deactivated by the potential VPO of the I/O terminal PO being equal to or lower than the Vdd+Vthp level. Accordingly, the node N2 is set at the power supply Vdd level.

The power supply Vdd level at the node N2 deactivates the PMOS transistor Q9 of the second switch SW2.

The PMOS transistor Q13 of the fourth switch circuit SW4 and the PMOS transistor Q16 of the sixth switch circuit SW6 are deactivated by the power supply Vdd level at the node N2 and the potential VPO of the I/O terminal PO being at the Vdd+Vthp level or less.

The NMOS transistor Q12 of the third switch circuit SW3 is deactivated by the low signal from the inverter 13 (the signal from the NOR circuit 12 being high). This disconnects the node N1 from the ground GND. In this state, the potential VN1 at the node N1 is set equal to or lower than a level that is lower than the potential VPO by the forward voltage VDF between the drain and back gate of the PMOS transistor Q13 (VPO+VDF).

In the fifth switch circuit SW5, the PMOS transistor Q14 is activated by the Vdd−Vthn level at the node N4 and the PMOS transistor Q15 is activated by the difference between the potential VN6 at the node N6 and the potential VN1 at the node N1. Accordingly, the back gates of the PMOS transistors Q2, Q3 of the main output circuit 4 are connected to the power supply Vdd and the node N3 is set at the power supply Vdd level.

In the main output circuit 4, the PMOS transistors Q2, Q3 is activated by the Vdd−Vthn level at the node N4, and the NMOS transistor Q4 is activated by the power supply Vdd level at the node N2.

Figure 6:
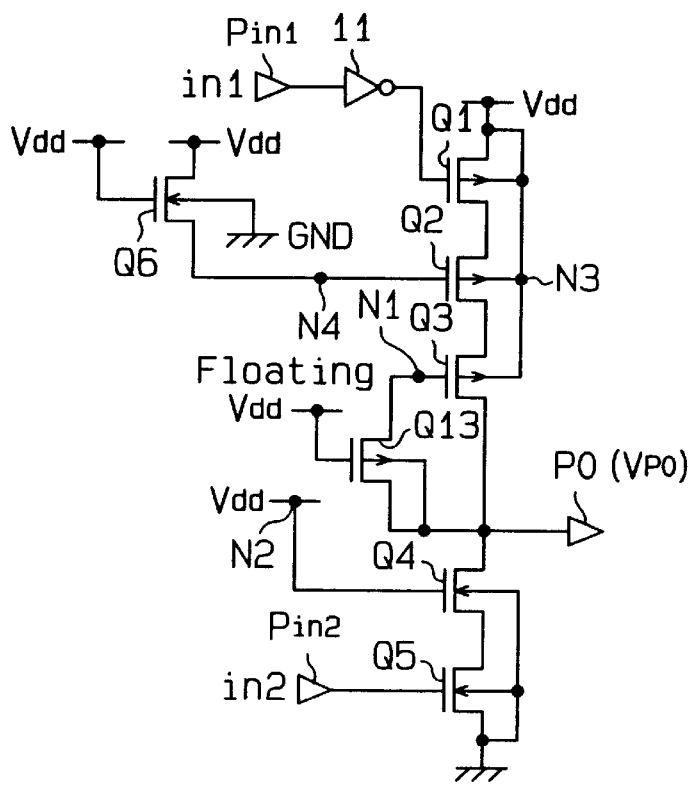
FIG. 6 is an equivalent circuit diagram of the input/output circuit under condition B of FIG. 4.

FIG. 6 is an equivalent circuit diagram showing the operation of the output circuit 2 under condition B of FIG. 4. In the main output circuit 4, when the first and second internal signals in1, in2 are both low, the PMOS transistor Q1 and the NMOS transistor Q5 are deactivated. Accordingly, the I/O terminal PO is set at a high impedance (Hi-Z) state. In this case, a voltage equal to or lower than the Vdd+Vthp level is applied to the I/O terminal PO. Thus, leakage current does not flow from the I/O terminal PO to the power supply Vdd via the PMOS transistors Q1–Q3.

[Condition C: the I/O terminal PO being in a high impedance (Hi-Z) state when a voltage exceeding the Vdd+Vthp level is applied to the I/O terminal PO]

Under this condition, the first and second internal signals in1, in2 provided to the output circuit 2 from the internal circuit are low, and the signal output by the NOR circuit 12 is high. In this state, the potential VPO at the I/O terminal PO exceeds the Vdd+Vthp level.

In the first switch circuit SW1, the NMOS transistors Q6, Q7 are activated and the NMOS transistor Q8 is deactivated.

Since the I/O terminal PO exceeds the Vdd+Vthp level, the PMOS transistor Q10 of the voltage generating circuit 6 is activated. Accordingly, the potential VN2 at the node N2 is set to a value obtained by equally dividing the potential difference between the power supply Vdd and the input terminal PO with the resistors 14, 15 ((Vdd+VPO)/2). In other words, the voltage generating circuit 6 adjusts the potential at the node N2 in accordance with the potential VPO at the I/O terminal PO.

The PMOS transistor Q9 of the second switch circuit SW2 is activated by the (Vdd+VPO)/2 level at the node N2. This connects the node N4 to the node N2 and sets the node N4 at the (Vdd+VPO)/2 level.

The transistor Q12 of the third switch circuit SW3 is deactivated by the low signal from the inverter 13 (the signal of the NOR circuit 12 being high). This disconnects the node N1 from the ground GND.

The PMOS transistor Q13 of the fourth switch circuit SW4 is activated by the potential difference between the (Vdd+VPO)/2 level at the node N2 and the potential VPO at the I/O terminal PO exceeding the Vdd+Vthp level. Accordingly, the node N1 is set at the VPO level.

The PMOS transistors Q14, Q15 of the fifth switch circuit SW5 are deactivated by the VPO level at the node N1 and the (Vdd+VPO)/2 level at the node N4. Accordingly, the back gates of the PMOS transistors Q2, Q3 in the main output circuit 4 are disconnected from the power supply Vdd.

The PMOS transistor Q16 of the sixth switch SW6 is activated and the node N3 is set at the VPO level. The PMOS transistors Q2, Q3 of the main output circuit 4 are deactivated.

Figure 7:
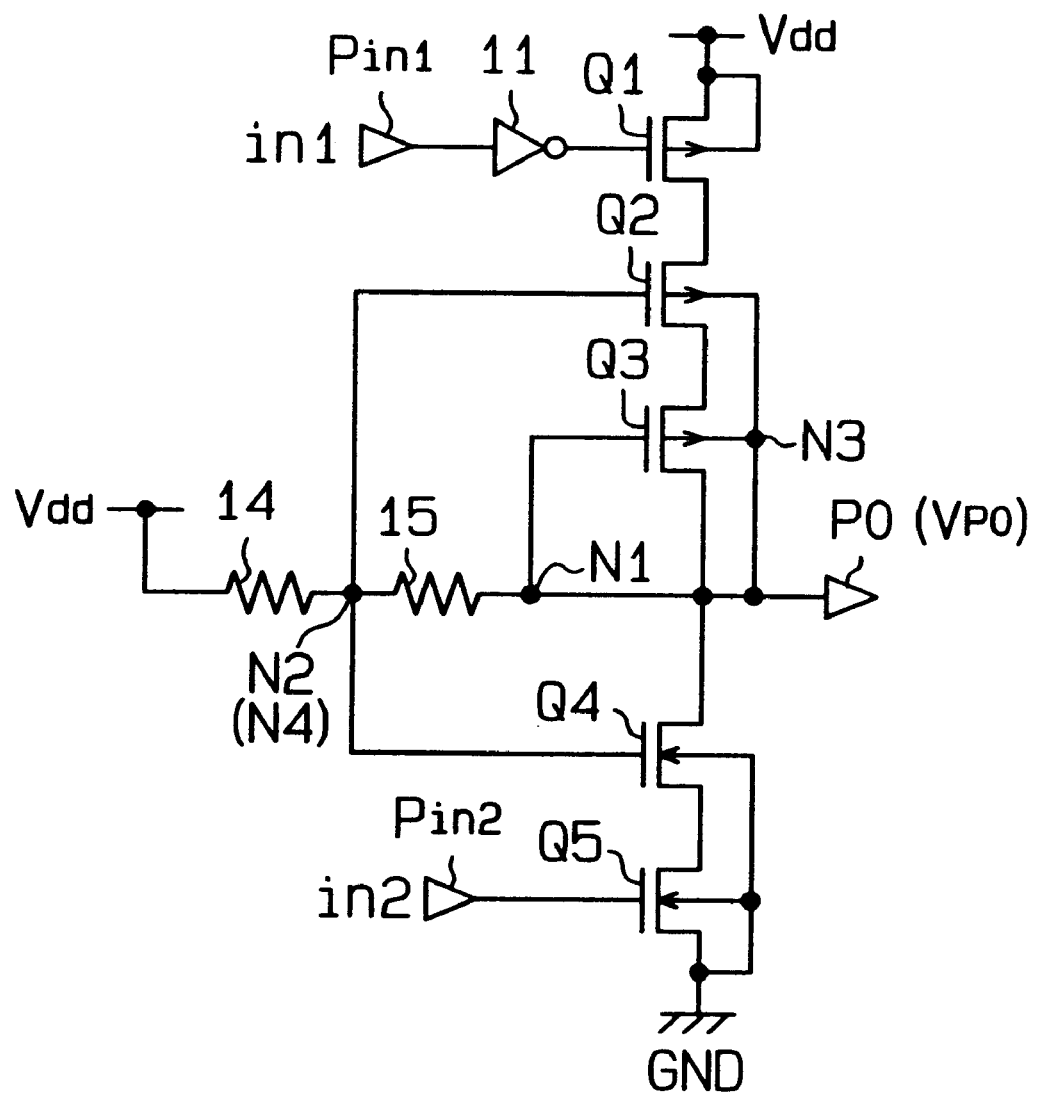
FIG. 7 is an equivalent circuit diagram of the I/O circuit under conditions C and D of FIG. 4.

FIG. 7 is an equivalent circuit diagram showing the operation of the output circuit 2 under conditions C and D of FIG. 4. In the main output circuit 4, the PMOS transistor Q1 and the NMOS transistor Q5 are deactivated when the first and second internal signals in1, in2 go low. This sets the I/O terminal PO in a high impedance (Hi-Z) state.

The back gates of the PMOS transistor Q2, Q3 are disconnected from the power supply Vdd by the fifth switch circuit SW5 even if the voltage applied to the I/O terminal PO exceeds the Vdd+Vthp level. Accordingly, leakage current does not flow from the I/O terminal PO to the power supply Vdd via the back gates of the PMOS transistors Q2, Q3.

The fourth switch circuit SW4 and the voltage generating circuit 6 maintain the gates of the transistors Q2–Q4 (the nodes N4, N1, N2) at the relatively high levels of (Vdd+VPO)/2, VPO, and (Vdd+VPO)/2, respectively. Accordingly, the potential difference between the gate and source/drain of each of the transistors Q2–Q4 does not exceed the voltage capacity of the transistors Q2–Q4. Thus, the transistors Q2–Q4 do not require a special insulation film to resist high voltages.

In this state, the gate potential at the NMOS transistor Q21 of the input circuit 3 is also maintained at a relatively high level of (Vdd+VPO)/2. Thus, a high voltage is not applied to the transistor Q21 at the gate and between the source and drain.

Under this condition, a potential having a level that is lower than the potential VN2 at the gate of the NMOS transistor Q21 by the threshold voltage Vthn of the transistor Q21 is applied to the input terminal of the input buffer 21.

In other words, a high voltage is not applied to the input terminal of the input buffer 21. Thus, the buffer 21 does not require a high voltage capacity structure.

The circuit between the source of the NMOS transistor Q21 (I/O terminal PO) and its back gate is equivalent to a diode connected in a reverse direction. Thus, leakage current does not flow from the I/O terminal PO to the ground GND via the source and back gate of the transistor Q21.

The fourth switch circuit SW4 connects the PMOS transistor Q3 gate (node N1) to the I/O terminal PO. Accordingly, the potential at the PMOS transistor Q3 gate is the same as the potential VPO at the I/O terminal PO. Thus, the PMOS transistor Q3 is not activated even when a voltage exceeding the Vdd+Vthp level is applied to the I/O terminal PO. Consequently, leakage current does not flow into the power supply Vdd from the I/O terminal PO via the PMOS transistor Q3.

Further, the sixth switch circuit SW6 connects the back gates of the PMOS transistors Q2, Q3 to the I/O terminal PO. Accordingly, the voltage at the back gate is the same as the voltage at the I/O terminal PO, current is prevented from being conducted through the parasitic thyristor device having a CMOS configuration, and latch-up is prevented. In an output circuit having an ordinary CMOS configuration, a parasitic thyristor device is formed between the power supply Vdd and the ground GND. The parasitic thyristor device is activated when the substrate enters a floating state and causes a large amount of current to flow between the power supply Vdd and the ground GND, causing a latch-up to occur.

[Condition D: application of voltage that is higher than the Vdd+Vthp level when the power supply is inhibited]

Since the power is not provided to the I/O circuit 1, the first and second internal signals in1, in2, the output signal of the NOR circuit 12 in the control circuit 5, and the output signal of the inverter 13 are at the ground GND level.

The PMOS transistor Q10 of the voltage generating circuit 6 is activated by the difference between the ground GND level potential applied to its gate and the potential exceeding the Vdd+Vthp level at the I/O terminal PO. Accordingly, the potential VN2 at the node N2 having a VPO/2 level, in which the difference between the power supply Vdd (in this case, the ground GND level) and the potential at the I/O terminal PO is equally divided by the resistors 14, 15, is applied to the node N2.

The PMOS transistor Q9 of the second switch circuit SW2 is activated by the VPO/2 level potential at the node N2, and the node N4 is connected to the node N2. Under this condition, the node between the NMOS transistors Q6, Q7 is in a floating state. Thus, the potential VN4 at the node N4 is set at the VPO/2 level.

The NMOS transistor Q12 of the third switch circuit SW3 is deactivated by the ground GND level output signal from the inverter 13. This disconnects the node N1 from the ground GND.

The PMOS transistor Q13 of the fourth switch circuit SW4 is activated by the difference between the VPO/2 level potential VN2 at the node N2 and the potential VPO exceeding the Vdd+Vthp level at the I/O terminal PO. This sets the potential VN1 at the node N1 to the VPO level.

In the fifth switch circuit SW5, the PMOS transistor Q14 is deactivated by the VPO/2 level potential at the node N4, and the PMOS transistor Q15 is deactivated by the VPO level potential at the node N1. This disconnects the back gates of the PMOS transistors Q2, Q3 in the main output circuit 4 from the power supply Vdd.

The PMOS transistor Q16 of the sixth switch circuit SW6 is activated and the potential VN3 at the node N3 is set at the VPO level.

The PMOS transistors Q2, Q3 of the main output circuit 4 are deactivated.

FIG. 7 is an equivalent circuit diagram showing the operation of the output circuit 2 under conditions C and D of FIG. 4. The fifth switch circuit SW5 disconnects the back gates of the PMOS transistors Q2, Q3 from the power supply Vdd even if a voltage exceeding the Vdd+Vthp level is applied to the I/O terminal PO. Accordingly, leakage current does not flow from the I/O terminal PO to the power supply Vdd via the back gates of the PMOS transistors Q2, Q3.

The fourth switch circuit SW4 and the voltage generating circuit 6 maintain the potentials at the gates of the transistors Q2–Q4 (nodes N4, N1, N2) at the relatively high levels of VPO/2, VPO, and VPO/2, respectively. Accordingly, a high voltage is not applied to the gate and between the source and drain in each of the transistors Q2–Q4. Thus, the transistors Q2–Q4 do not require a high voltage capacity structure.

Under this condition, the gate potential at the NMOS transistor Q21 of the input circuit 3 is also maintained at a relatively high (Vdd+VPO) level. Thus, a high voltage is not applied to the gate and between the source and drain in the transistor Q21. In this state, the potential at the input terminal of the input buffer 21 does not exceed the VN2–Vthn level. Therefore, a high voltage is not applied to the input terminal of the input buffer 21. Accordingly, the buffer 21 does not require a high voltage capacity structure.

In the NMOS transistor Q21, the circuit between the source (I/O terminal PO) and the back gate is equivalent to a diode connected in a reverse direction. Thus, leakage current does not flow from the I/O terminal PO to the ground GND via the source and back gate of the transistor Q21.

The fourth switch circuit SW4 connects the PMOS transistor Q3 gate (node N1) to the I/O terminal PO so that the gate potential and the potential VPO at the input output terminal PO are the same. Accordingly, leakage current does not flow from the I/O terminal PO to the power supply Vdd via the PMOS transistor Q3.

The advantages of the I/O circuit 1 will now be described.

(1) The PMOS transistors Q1–Q3 are used as push transistors of the output circuit 2. This fully swings the data signal out between the power supply Vdd level and the ground GND level.

(2) During normal output operation of the output circuit 2, the PMOS transistors Q2, Q3, and the NMOS transistor Q4 are maintained in an activated state. Accordingly, the operational noise of the transistors Q2–Q4 is not included in the data signal out. Thus, the output of the data signal out is stabilized.

(3) The fifth switch circuit SW5 disconnects the back gates of the PMOS transistors Q2, Q3 from the power supply Vdd when a voltage exceeding the Vdd+Vthp level is applied to the I/O terminal PO. Accordingly, leakage current does not flow from the I/O terminal PO to the power supply Vdd via the back gates of the PMOS transistors Q2, Q3.

(4) When a voltage exceeding the Vdd+Vthp level is applied to the I/O terminal PO, the fourth switch circuit SW4 and the voltage generating circuit 6 maintains the potentials at the gates of the transistors Q2–Q4 (nodes N4, N1, N2) at the relatively high levels of VPO/2, VPO, and VPO/2, respectively. Accordingly, a high voltage is not applied to the gate and between the source and drain in each of the transistors Q2–Q4. Thus, the transistors Q2–Q4 do not require a high voltage capacity structure.

(5) When the voltage applied to the I/O terminal PO exceeds the Vdd+Vthp level, the fourth switch circuit SW4 connects the PMOS transistor Q3 gate (node N1) to the I/O terminal PO. Accordingly, the potential at the gate of the PMOS transistor Q3 is the same as the potential VPO at the I/O terminal PO. Thus, the PMOS transistor Q3 is not activated. As a result, leakage current does not flow to the power supply Vdd from the I/O terminal PO via the PMOS transistor Q3.

(6) The sixth switch circuit SW6 connects the back gates of the PMOS transistors Q2, Q3 in the fifth switch circuit SW5 to the I/O terminal PO when disconnecting the back gates from the power supply Vdd. Accordingly, the potential at the back gates is the same as the potential at the I/O terminal PO. Further, activation of the parasitic thyristor formed by the CMOS configuration main output circuit 4 is prevented and latch-up does not occur.

(7) The NMOS transistor Q21 is connected between the I/O terminal PO and the input terminal of the input buffer 21. This inhibits the potential at the input terminal of the input buffer 21 at a level lower than the potential VN2 at the gate of the NMOS transistor Q21 by the threshold voltage Vthn of the transistor Q21 (VN2−Vthn). Accordingly, a high voltage is not applied to the input terminal of the input buffer 21 and the buffer 21 thus does not require a high voltage capacity structure.

(8) In the NMOS transistor Q21 of the input circuit 3, the circuit between the source (I/O terminal PO) and the back gate is equivalent to a diode connected in a reverse direction. Thus, leakage current does not flow from the I/O terminal PO to the ground GND via the source and back gate of the transistor Q21.

(9) When a voltage exceeding the Vdd+Vthp level is applied to the I/O terminal PO, the voltage generating circuit 6 maintains the potential at the gate of the transistor Q21 of the input circuit 3 at the relatively high level of (Vdd+VPO)/2. Thus, a high voltage is not applied to the gate and between the source and drain of the transistor Q21.

(10) The voltage generating circuit 6, which is formed by the resistors 14, 15, and the PMOS transistor Q21, generates voltage for driving each of the switch circuits SW2–SW6 and the NMOS transistor Q21 of the input circuit 3. In other words, the switch circuits SW2–SW6 and the NMOS transistor Q21 are driven by a single voltage generating circuit 6 having a relatively simple circuit configuration. This keeps the circuit area of the I/O circuit 1 small.

It should be apparent to those skilled in the art that the present invention may be embodied in many other specific forms without departing from the spirit or scope of the invention. Particularly, it should be understood that the present invention may be embodied in the following forms.

(1) The configurations of the first to sixth switch circuits SW1–SW6, the voltage generating circuit 6, and the control circuit 5 are not limited to those illustrated in FIG. 3.

(2) All of the first to sixth switch circuits SW1–SW6 do not necessarily have to be included in the output circuit 2.

(3) The input circuit 3 does not have to be formed by the input buffer 21 and the NMOS transistor Q21. Further, the input circuit 3 may be eliminated.

(4) The main output circuit 4 is not required to have three push transistors. Further, the number of pull transistors is not limited to two.

(5) A low voltage power supply having a level other than the ground GND level may be employed.

(6) The voltage generating circuit 6 may adjust the potential at the node N2 as necessary in accordance with the potential VPO at the I/O terminal PO.

The present examples and embodiments are to be considered as illustrative and not restrictive, and the invention is not to be limited to the details given herein, but may be modified within the scope and equivalence of the appended claims.

What is claimed is:

1. An output circuit having an output terminal, comprising:
    at least one p-channel MOS transistor connected between the output terminal and a high potential power supply, and having a back gate;
    a first switch circuit connected between the at least one p-channel MOS transistor and the high potential power supply, wherein the first switch circuit selectively connects the back gate of the at least one p-channel MOS transistor and the high potential power supply in response to a signal applied to the output terminal; and
    at least one MOS transistor connected to the output terminal, wherein the at least one MOS transistor is not directly connected to the high potential power supply.

2. The output circuit according to claim 1, wherein the first switch circuit disconnects the back gate from the high potential power supply when the external signal applied to the output terminal has a potential level higher than that of the high potential power supply.

3. The output circuit according to claim 1, wherein a plurality of p-channel MOS transistors are connected in series between the high potential power supply and the output terminal, and wherein the first switch circuit is formed by at least the transistor located closest to the output terminal.

4. The output circuit according to claim 1, wherein the first switch circuit includes a switching MOS transistor activated and deactivated in response to the external signal.

5. The output circuit according to claim 4, further comprising a voltage generating circuit connected to a gate of the switching MOS transistor, wherein the voltage generating circuit adjusts the potential applied to a gate of the switching MOS transistor in accordance with the potential of the external signal.

6. The output circuit according to claim 1, further comprising a second switch circuit connected between the first switch circuit and the output terminal, wherein the second switch circuit connects the back gate of the at least one p-channel MOS transistor to the output terminal when the first switch circuit disconnects the back gate from the high potential power supply.

7. The output circuit according to claim 6, wherein the second switch circuit includes a switching MOS transistor activated when the first switch circuit disconnects the back gate of the at least one p-channel MOS transistor from the high potential power supply.

8. The output circuit according to claim 7, further comprising a voltage generating circuit connected to a gate of the switching MOS transistor, wherein the voltage generating circuit adjusts the potential applied to the gate of the switching MOS transistor in accordance with the potential of the external signal.

9. An output circuit having an output terminal, comprising:
    at least one p-channel MOS transistor connected between the output terminal and a high potential power supply;
    a switch circuit connected between a gate of the at least one transistor and the output terminal, wherein the switch circuit connects the gate of the at least one p-channel MOS transistor to the output terminal in response to a signal applied to the output terminal; and at least one MOS transistor connected to the output terminal, wherein the at least one MOS transistor is not directly connected to the high potential power supply.

10. The output circuit according to claim 9, wherein the switch circuit connects the gate of the at least one p-channel MOS transistor to the output terminal when the external signal has a potential level higher than that of the high potential power supply.

11. The output circuit according to claim 9, wherein a plurality of p-channel MOS transistors are connected in series between the high potential power supply and the output terminal, and wherein the switch circuit is formed by at least the transistor located closest to the output terminal.

12. The output circuit according to claim 9, wherein the switch circuit includes a switching MOS transistor activated and deactivated in response to the potential of the external signal.

13. The output circuit according to claim 12, further comprising a voltage generating circuit connected to a gate of the switching MOS transistor, wherein the voltage generating circuit adjusts the potential applied to the gate of the switching MOS transistor in accordance with the potential of the external signal.

14. An output circuit having an output terminal, comprising:
  a plurality of p-channel MOS transistors connected between the output terminal and a high potential power supply;
  a plurality of n-channel MOS transistors connected between the output terminal and a low potential power supply; and
  a voltage generating circuit connected to a gate of one of the p-channel MOS transistors and the n-channel MOS transistors, wherein the voltage generating circuit adjusts the potential applied to the gate in response to a signal applied to the output terminal so that a potential difference between the output terminal and the gate is less than a voltage resistance value of the gate connected translator, wherein at least one of the n-channel MOS transistors is connected to the output terminal and is not directly connected to the high potential power supply.

15. The output circuit according to claim 14, wherein the voltage generating circuit sets the potential at the gate of the transistor to a level lower than the voltage capacity when the external signal has a potential level higher than that of the high potential power supply.

16. The output circuit according to claim 14, wherein the voltage generating circuit is connected to at least the transistor located closest to the output terminal.

17. The output circuit according to claim 14, wherein the voltage generating circuit includes a voltage dividing circuit connected between the high potential power supply and the output terminal, wherein the voltage dividing circuit divides the resistance of the potential difference between the output terminal and the gate of the transistor to generate a gate potential having a predetermined level when the potential difference exceeds a predetermined value.

18. An output circuit having an output terminal, comprising:
  a plurality of p-channel MOS transistors, including a first p-channel MOS transistor which has a back gate, connected in series between the output terminal and a high potential power supply;
  a first switch circuit connected between the back gate of the first p-channel MOS transistor and the high potential power supply, wherein the first switch circuit selectively connects and disconnects the back gate of the first transistor and the high potential power supply in response to a signal applied to the output terminal;
  a voltage generating circuit connected to a gate of the first p-channel MOS transistor, wherein the voltage generating circuit adjusts the potential applied to the gate of the first p-channel MOS transistor in response to a signal applied to the output terminal so that a potential difference between the output terminal and the gate is less than a voltage capacity of the transistor; and
  at least one MOS transistor connected to the output terminal, wherein the at least one MOS transistor is not directly connected to the high potential power supply.

19. The output circuit according to claim 18, wherein the first switch circuit includes a switching p-channel MOS transistor connected to the gate of the first p-channel MOS transistor.

20. The output circuit according to claim 19, wherein the voltage generating circuit adjusts the potential applied to a gate of the switching p-channel MOS transistor so that a potential difference between the output terminal and the gate of the switching p-channel MOS transistor is less than a voltage capacity of the switching p-channel MOS transistor.

21. An output circuit having an output terminal, comprising:
  a plurality of a p-channel MOS transistors, including a first p-channel MOS transistor which has a back gate, connected in series between the output terminal and a high potential power supply;
  a first switch circuit connected between the back gate of the first p-channel MOS transistor and the high potential power supply, wherein the first switch circuit selectively connects and disconnects the back gate of the first transistor and the high potential power supply in response to an external signal applied to the output terminal;
  a voltage generating circuit connected to a gate of the first p-channel MOS transistor, wherein the voltage generating circuit adjusts the potential applied to the gate of the first p-channel MOS transistor in response to an external signal applied to the output terminal so that a potential difference between the output terminal and the gate is less than a voltage capacity of the transistor;
  a second switch circuit connected between the second switch circuit and the output terminal, wherein the second switch circuit connects the back gate of the first p-channel MOS transistor to the output terminal when the first switch circuit disconnects the back gate of the first p-channel MOS transistor from the high potential power supply; and
  a third switch circuit connected between the first p-channel MOS transistor and the output terminal, wherein the third switch circuit connects the gate of the first p-channel MOS transistor to the output terminal when the external signal is applied to the output terminal.

22. The output circuit according to claim 21, further comprising a fourth switch circuit for connecting the gate of the first p-channel MOS transistor to a low potential power supply when a signal having the level of the high potential power supply is output from the output terminal via the plurality of p-channel MOS transistors.

23. The output circuit according to claim 22, further comprising:
  a plurality of n-channel MOS transistors connected between the output terminal and the low potential power supply, and including a first n-channel MOS transistor; and a fifth switch circuit for connecting the gate of the first n-channel MOS transistor to the high potential power supply when a signal having the level of the low potential power supply is output from the output terminal via the plurality of n-channel MOS transistors.

24. An input/output circuit, comprising:

at least one p-channel MOS transistor connected between an output terminal and a high potential power supply, and having a back gate;

a main output circuit including a first switch circuit connected between the back gate of the at least one p-channel MOS transistor and the high potential power supply, wherein the first switch circuit selectively connects and disconnects the back gate of the transistor and the high potential power supply in response to an external signal applied to the output terminal;

an input buffer;

an input circuit including an n-channel MOS transistor connected between the input buffer and the output terminal; and a voltage generating circuit connected to a gate of the n-channel MOS transistor, wherein the voltage generating circuit adjusts the potential applied to the gate of the n-channel MOS transistor in response to the external signal applied to the output terminal so that a potential difference between the output terminal and the gate of the n-channel MOS transistor is less than a voltage capacity of the n-channel MOS transistor.

* * * * *